United States Patent
Yan

(10) Patent No.: US 10,575,374 B2
(45) Date of Patent: Feb. 25, 2020

(54) PACKAGE FOR FLIP-CHIP LEDS WITH CLOSE SPACING OF LED CHIPS

(71) Applicant: LedEngin, Inc., San Jose, CA (US)

(72) Inventor: Xiantao Yan, Palo Alto, CA (US)

(73) Assignee: LedEngin, Inc., San Jose, CA (US)

( * ) Notice: Subject to any disclaimer, the term of this patent is extended or adjusted under 35 U.S.C. 154(b) by 0 days.

(21) Appl. No.: 15/916,652

(22) Filed: Mar. 9, 2018

(65) Prior Publication Data

US 2019/0281672 A1 Sep. 12, 2019

(51) Int. Cl.
*H01L 33/62* (2010.01)
*H05B 33/08* (2020.01)

(52) U.S. Cl.
CPC ......... *H05B 33/0806* (2013.01); *H01L 33/62* (2013.01); *H01L 2224/42* (2013.01)

(58) Field of Classification Search
CPC .. H05B 33/0806; H01L 33/62; H01L 2224/42
See application file for complete search history.

(56) References Cited

U.S. PATENT DOCUMENTS

| | | | |
|---|---|---|---|
| 5,959,316 A | 9/1999 | Lowery | |
| 6,127,783 A | 10/2000 | Pashley et al. | |
| 6,307,160 B1 | 10/2001 | Mei et al. | |
| 6,351,069 B1 | 2/2002 | Lowery et al. | |
| 6,384,473 B1 * | 5/2002 | Peterson | B81B 7/0067 257/680 |
| 6,495,964 B1 | 12/2002 | Muthu et al. | |
| 6,608,332 B2 | 8/2003 | Shimizu et al. | |
| 6,614,179 B1 | 9/2003 | Shimizu et al. | |
| 6,642,652 B2 | 11/2003 | Collins, III et al. | |
| 6,661,084 B1 * | 12/2003 | Peterson | H01L 25/105 257/680 |
| 6,680,128 B2 | 1/2004 | Mei | |

(Continued)

FOREIGN PATENT DOCUMENTS

| CN | 201568763 | 9/2010 |
|---|---|---|
| CN | 101907230 | 6/2012 |

(Continued)

OTHER PUBLICATIONS

Solvent Soluble Polyimide with High Transparency and High Tg: HOP-400, 500, Hitachi Cable Review, vol. 22, Aug. 2003, p. 78.

(Continued)

*Primary Examiner* — Donald L Raleigh
(74) *Attorney, Agent, or Firm* — Kilpatrick Townsend & Stockton LLP

(57) ABSTRACT

An emitter for an LED-based lighting device can incorporate "flip-chip" LEDs, in which all electrical contacts are disposed on the bottom surface of the chip. The emitter base can be a multilayer high-temperature cofired ceramic (HTCC) substrate, with metal traces formed between the layers and vias through the layers to join traces in different layers, thereby providing electrical connectivity to each LED. The paths can be arranged such that current can be supplied independently to different subsets of the LEDs. The top layer of the emitter base is fabricated with exposed vias at the top surface. Metal pads are then printed onto the exposed vias on the top surface, and flip-chip LEDs are bonded to the metal pads, e.g., using solder.

20 Claims, 6 Drawing Sheets

(56) References Cited

U.S. PATENT DOCUMENTS

| | | |
|---|---|---|
| 6,777,883 B2 | 8/2004 | Mukherjee |
| 6,791,116 B2 | 9/2004 | Takahashi et al. |
| 6,828,170 B2 | 12/2004 | Roberts et al. |
| 6,967,447 B2 | 11/2005 | Lim et al. |
| 7,064,353 B2 | 6/2006 | Bhat |
| 7,139,125 B1 | 11/2006 | Mi |
| 7,156,538 B2 | 1/2007 | Han et al. |
| 7,157,744 B2 | 1/2007 | Palmteer et al. |
| 7,168,608 B2 | 1/2007 | Mei |
| 7,199,446 B1 | 4/2007 | Mei et al. |
| 7,230,222 B2 | 6/2007 | Cheng et al. |
| 7,264,378 B2 | 9/2007 | Loh |
| 7,465,069 B2 | 12/2008 | Li |
| 7,473,933 B2 | 1/2009 | Yan |
| 7,670,872 B2 | 3/2010 | Yan |
| 7,772,609 B2 | 8/2010 | Yan |
| 8,013,533 B2 | 9/2011 | De Rijck et al. |
| 8,075,165 B2 | 12/2011 | Jiang et al. |
| 8,344,629 B2 | 1/2013 | Deixler |
| 8,384,097 B2 | 2/2013 | Yan |
| 8,598,793 B2 | 12/2013 | Yan et al. |
| 8,716,725 B2 | 5/2014 | Yan |
| 8,773,024 B2 | 7/2014 | Yan et al. |
| 9,080,729 B2 | 7/2015 | Jiang |
| 9,543,280 B2 * | 1/2017 | Cho .................. H01L 25/0753 |
| 9,554,457 B2 | 1/2017 | Yan |
| 9,970,628 B2 | 5/2018 | Zhang |
| 2001/0015778 A1 | 8/2001 | Murade et al. |
| 2002/0004251 A1 | 1/2002 | Roberts et al. |
| 2002/0015013 A1 | 2/2002 | Ragle |
| 2002/0047624 A1 | 4/2002 | Stam et al. |
| 2002/0163006 A1 | 11/2002 | Yoganandan et al. |
| 2002/0191885 A1 | 12/2002 | Wu et al. |
| 2003/0016899 A1 | 1/2003 | Yan |
| 2003/0086674 A1 | 5/2003 | Yan et al. |
| 2003/0095399 A1 | 5/2003 | Grenda et al. |
| 2003/0116769 A1 | 6/2003 | Song et al. |
| 2003/0122482 A1 | 7/2003 | Yamanaka et al. |
| 2003/0227249 A1 | 12/2003 | Mueller et al. |
| 2003/0230977 A1 | 12/2003 | Epstein |
| 2004/0004437 A1 | 1/2004 | Shimizu et al. |
| 2004/0051111 A1 | 3/2004 | Ota et al. |
| 2004/0079957 A1 | 4/2004 | Andrews et al. |
| 2004/0087165 A1 | 5/2004 | Theiss et al. |
| 2004/0102061 A1 | 5/2004 | Watanabe |
| 2004/0114393 A1 | 6/2004 | Galli |
| 2004/0126918 A1 | 7/2004 | Kurahashi et al. |
| 2004/0150991 A1 | 8/2004 | Ouderkirk et al. |
| 2004/0173810 A1 | 9/2004 | Lin et al. |
| 2004/0201025 A1 | 10/2004 | Barnett et al. |
| 2004/0208210 A1 | 10/2004 | Inoguchi |
| 2004/0257496 A1 | 12/2004 | Sonoda et al. |
| 2005/0035364 A1 | 2/2005 | Sano et al. |
| 2005/0093146 A1 | 5/2005 | Sakano |
| 2005/0127281 A1 | 6/2005 | Zheng et al. |
| 2005/0128751 A1 | 6/2005 | Roberge et al. |
| 2005/0145872 A1 | 7/2005 | Fang et al. |
| 2005/0162864 A1 | 7/2005 | Verdes et al. |
| 2005/0179376 A1 | 8/2005 | Fung et al. |
| 2005/0199900 A1 | 9/2005 | Lin et al. |
| 2005/0224830 A1 | 10/2005 | Blonder et al. |
| 2005/0253242 A1 | 11/2005 | Costello et al. |
| 2005/0286131 A1 | 12/2005 | Saxena et al. |
| 2006/0002110 A1 | 1/2006 | Dowling et al. |
| 2006/0012299 A1 | 1/2006 | Suehiro et al. |
| 2006/0063287 A1 | 3/2006 | Andrews |
| 2006/0082296 A1 | 4/2006 | Chua et al. |
| 2006/0082679 A1 | 4/2006 | Chua et al. |
| 2006/0091416 A1 | 5/2006 | Yan |
| 2006/0091788 A1 | 5/2006 | Yan |
| 2006/0097385 A1 | 5/2006 | Negley |
| 2006/0170332 A1 | 8/2006 | Tamaki et al. |
| 2006/0227558 A1 | 10/2006 | Osawa et al. |
| 2006/0284209 A1 | 12/2006 | Kim et al. |
| 2007/0023769 A1 | 2/2007 | Nishimoto et al. |
| 2007/0081360 A1 | 4/2007 | Bailey et al. |
| 2007/0085103 A1 | 4/2007 | Nishioka et al. |
| 2007/0090378 A1 * | 4/2007 | Lee .................. H01L 33/44 257/94 |
| 2007/0139437 A1 | 6/2007 | Boroson et al. |
| 2007/0170449 A1 | 7/2007 | Anandan |
| 2007/0194341 A1 | 8/2007 | Chang et al. |
| 2007/0235639 A1 | 10/2007 | Rains, Jr. |
| 2007/0241357 A1 | 10/2007 | Yan |
| 2008/0083931 A1 | 4/2008 | Bando et al. |
| 2008/0088244 A1 | 4/2008 | Morishita |
| 2008/0149962 A1 | 6/2008 | Kim et al. |
| 2008/0278691 A1 | 11/2008 | Willemsen et al. |
| 2008/0308825 A1 | 12/2008 | Chakraborty et al. |
| 2009/0224268 A1 * | 9/2009 | Tsuchiya .............. H01L 33/486 257/88 |
| 2009/0316399 A1 | 12/2009 | Chang |
| 2009/0316409 A1 | 12/2009 | Kim et al. |
| 2010/0060185 A1 | 3/2010 | Van Duijneveldt |
| 2010/0066255 A1 | 3/2010 | Roberts |
| 2010/0259930 A1 | 10/2010 | Yan |
| 2011/0012512 A1 | 1/2011 | Young et al. |
| 2011/0095686 A1 | 4/2011 | Falicoff et al. |
| 2011/0121326 A1 * | 5/2011 | Tan .................. H01L 33/60 257/88 |
| 2011/0178582 A1 | 7/2011 | Dougal |
| 2011/0198653 A1 | 8/2011 | Cho |
| 2011/0248289 A1 | 10/2011 | Hsieh et al. |
| 2011/0291135 A1 | 12/2011 | Hsieh et al. |
| 2012/0224363 A1 | 9/2012 | Van De Ven |
| 2012/0286669 A1 | 11/2012 | Yan et al. |
| 2012/0306370 A1 | 12/2012 | Van De Ven et al. |
| 2013/0026511 A1 | 1/2013 | Yeh et al. |
| 2013/0093354 A1 | 4/2013 | Jiang |
| 2013/0229125 A1 | 9/2013 | Yan et al. |
| 2014/0209939 A1 | 7/2014 | Yan |
| 2015/0061508 A1 | 3/2015 | Yan et al. |
| 2015/0214194 A1 | 7/2015 | Yan |
| 2015/0282260 A1 | 10/2015 | Hussell et al. |
| 2016/0149088 A1 | 5/2016 | Yan et al. |
| 2017/0018697 A1 * | 1/2017 | Konishi .............. H01L 25/0753 |
| 2017/0373044 A1 * | 12/2017 | Das .................. H01L 21/02063 |
| 2018/0145059 A1 * | 5/2018 | Welch .................. H01L 25/0753 |

FOREIGN PATENT DOCUMENTS

| | | |
|---|---|---|
| CN | 202523752 | 11/2012 |
| CN | 202756929 | 2/2013 |
| CN | 102074637 | 6/2013 |
| CN | 202992786 | 6/2013 |
| CN | 203258423 | 10/2013 |
| CN | 101894901 | 11/2013 |
| CN | 103148354 | 6/2016 |
| CN | 104049444 | 9/2016 |
| EP | 734009 | 9/1996 |
| EP | 1152642 | 11/2001 |
| EP | 2381474 | 10/2011 |
| EP | 2523534 | 11/2012 |
| JP | 2000349346 | 12/2000 |
| JP | 2000349347 | 12/2000 |
| JP | 2001057445 | 2/2001 |
| JP | 2002185046 | 6/2002 |
| JP | 2004241704 | 8/2004 |
| JP | 2004253404 | 9/2004 |
| KR | 1020110118523 | 10/2011 |
| KR | 20140121214 | 10/2014 |
| WO | 2005009085 | 1/2005 |
| WO | 2006071628 | 7/2006 |
| WO | 2008061560 | 5/2008 |
| WO | 2008152922 | 12/2008 |
| WO | 2009073394 | 6/2009 |
| WO | 2016086180 | 6/2016 |

OTHER PUBLICATIONS

U.S. Appl. No. 12/756,861, Non-Final Office Action dated Jan. 18, 2012, 18 pages.

(56) References Cited

OTHER PUBLICATIONS

U.S. Appl. No. 13/106,808, Non-Final Office Action dated Apr. 12, 2013, 10 pages.
U.S. Appl. No. 13/106,808, Notice of Allowance dated Jul. 25, 2013, 9 pages.
U.S. Appl. No. 13/272,768, Final Office Action dated Feb. 24, 2014, 12 pages.
U.S. Appl. No. 13/272,768, Final Office Action dated Dec. 4, 2014, 8 pages.
U.S. Appl. No. 13/272,768, Non-Final Office Action dated Aug. 22, 2014, 10 pages.
U.S. Appl. No. 13/272,768, Non-Final Office Action dated Oct. 24, 2013, 13 pages.
U.S. Appl. No. 13/774,414, Notice of Allowance dated Dec. 23, 2013, 10 pages.
U.S. Appl. No. 14/165,372, Non-Final Office Action dated Mar. 16, 2015, 6 pages.
U.S. Appl. No. 14/231,406, Final Office Action dated Nov. 20, 2015, 19 pages.
U.S. Appl. No. 14/322,841, Notice of Allowance dated Jan. 13, 2015, 8 pages.
U.S. Appl. No. 14/952,648, Non-Final Office Action dated Jun. 29, 2016, 12 pages.
U.S. Appl. No. 14/952,648, Notice of Allowance dated Dec. 30, 2016, 9 pages.
Chinese Application No. 201010149882.X, Office Action dated Mar. 5, 2012, 12 pages (6 pages of Original Document and 6 pages of English Translation).
European Application No. 12166091.4, Extended European Search Report dated Jul. 18, 2013, 7 pages.
Kading et al., Thermal Conduction in Metallized Silicon-Dioxide Layers on Silicon, Appl. Phys. Lett. 65, vol. 13, Sep. 26, 1994, pp. 1629-1631.
International Application No. PCT/US2015/062760, International Search Report and Written Opinion dated Feb. 29, 2016, 11 pages.
Yan, Analysis Based Design Guidelines for Metal Runner and Passivation Layers in IC Packaging, Delphi Automotive Systems Analytical Engineering Conference, May 2000, pp. 1-4.
Yan et al., Two Test Specimens for Determining the Interfacial Fracture Toughness in Flip-Chip Assemblies, Transactions of the ASME, Journal of Electronic Packaging, vol. 120, Issue 2, Special Section Technical Papers, Jun. 1, 1998, pp. 150-155.

* cited by examiner

PACKAGE FOR FLIP-CHIP LEDS WITH CLOSE SPACING OF LED CHIPS

BACKGROUND

This disclosure relates generally to packages for lighting devices that incorporate light-emitting diodes (LEDs) and in particular to a package for flip-chip LEDs with close spacing of LED chips.

Etendue quantifies the size and angular spread of a beam of light. In the case of a light source, etendue is calculated by multiplying the area of the light source and the solid angle of the emitted light beam. Etendue is subject to the following conservation principle: given a particular light source, etendue cannot be decreased without incurring light loss.

In some contexts, such as stage lighting, low etendue is particularly desirable because lighting devices with low etendue provide more control over the lighting of particular portions of the stage. Low etendue, combined with the ability to control the color and brightness of individual lighting devices, allows production designers to achieve desired effects, such as spotlighting particular actors or portions of the set, illuminating different areas in different colors, etc.

LED-based lighting technology offers the prospect of energy-efficient and customizable theater lighting. An LED (or "LED chip"), as used herein, refers to a light-emitting diode, i.e., a semiconductor device that emits light in response to electrical current. LEDs typically emit narrow-band light, with a central frequency that depends on the particular construction of the LED. At present, LEDs are commercially available at various wavelengths spanning the visible-light spectrum from red to violet; infrared and ultra-violet LEDs are also commercially available. LED chips are typically fabricated to include a light-emitting surface (which may be identified as the "top" surface) and at least two metal bonding pads, which are typically disposed on the top and/or bottom surfaces of the LED chip. In some cases, some or all of the light-emitting surface of the LED may be coated with a wavelength-shifting material (e.g., phosphor) that shifts some of the light emitted by the LED to a longer wavelength. For instance, a "white" LED can be created by applying yellow phosphor material to a blue LED chip or by other processes that provide light of a combination of wavelengths.

In application, LEDs are typically packaged into structures referred to as "emitters." As used herein, an "emitter" refers to a structure that includes one or more LEDs and additional structures that provide mechanical and electrical support for the LED(s) as well as transfer of heat away from the LED(s). For instance, an emitter typically includes a substrate (e.g., a ceramic substrate) that may be patterned with electrical contacts. The LED(s) can be mounted on the substrate and bonded to some of the electrical contacts; other electrical conducts may be used to connect the emitter to a current source to drive the LED(s). An emitter may also include a cover disposed over the LED(s) to protect the LED(s) from the elements while allowing light to escape. The cover can be optically transparent and may incorporate wavelength-shifting elements, focusing or defocusing elements (e.g., a convex or concave surface that provides lensing behavior) diffusive elements, or the like. An emitter typically provides exposed electrical contacts that can be connected to an external power source to deliver operating current to the LED(s).

Existing emitters are generally not optimal for theater lighting and other contexts where low entendue is desired. For example, to produce a bright enough light for use in a theater context typically requires that the light source include a large number of LEDs, and the requirements of thermal and electrical performance may limit the density of LEDs in an emitter. For a given brightness, limits on the density of LEDs translate into a lower limit on the area of the light source, which may undesirably increase etendue. Accordingly, LED-based lighting devices with reduced etendue would be desirable.

SUMMARY

Reducing etendue of an LED-based lighting device requires attention to a number of considerations. For example, in order to be operative, each LED in an emitter is electrically connected to a current source. In the case of emitters for theater lighting, it may be desirable to include in the emitter LEDs of a number of different colors (e.g., a combination of red, green, blue, and possibly other colors such as amber, cyan, and/or white), with the LEDs of each color receiving current independently, thereby allowing the color of the output light to be controlled by supplying different currents to different subsets of the LEDs. But supplying different currents to different LEDs requires separate current paths to different LEDs; simply connecting all the LEDs in series (or in parallel) would not allow color control. Further, to produce bright light with a light source of small surface area requires the use of LEDs with high operating current. Such LEDs generate significant amounts of heat, which must be transferred away in order to prevent damage to the LEDs.

Certain embodiments of the present invention provide emitters for LED-based lighting devices that address these and other challenges. For instance, emitters described herein incorporate "flip-chip" LEDs, in which all electrical contacts are disposed on the bottom surface of the chip (opposite the primary light-emitting surface). Among other advantages, use of flip-chip LEDs eliminates the need to leave space between adjacent LEDs to accommodate bonding pads for wire bonds. In some embodiments, the emitter has, as a base, a multilayer high-temperature cofired ceramic (HTCC) substrate, with metal traces (or paths) formed between the layers and vias through the layers to join traces in different layers, thereby providing electrical connectivity to each LED. The paths can be arranged such that current can be supplied independently to different subsets, or groups, of the LEDs. (It is to be understood that a "group" of LEDs may include any number of LEDs, including just one LED.) The top layer of the HTCC substrate is fabricated with exposed vias at the top surface. Metal pads are then printed onto the exposed vias on the top surface, and flip-chip LEDs are bonded to the metal pads, e.g., using solder. The spacing between adjacent LEDs can be made small, e.g., 20 μm, limited by the precision of the pad-printing and LED-placement processes. In some embodiments, some or all of the LEDs at the periphery of an array of LEDs within an emitter can be either flip-chip LEDs or wire-bonded LEDs while LEDs in "central" positions (completely surrounded by other LEDs) are flip-chip LEDs. In other embodiments, all of the LEDs within an emitter are flip-chip LEDs.

In one process for making a substrate for an emitter, a multilayer HTCC substrate is fabricated, with metal traces formed between the layers and vias formed through the layers. After fabrication and cooling, the top surface of the substrate is polished and cleaned. At this stage, the top surface has exposed vias. A patterned metal layer is printed onto the top surface, e.g., using techniques for printing metal patterns onto semiconductor devices. This patterned metal layer includes bonding pads for flip-chip LEDs. In some embodiments, a superstructure can be formed or attached over the top surface of the substrate, e.g., by bonding one or more suitably shaped layers of HTCC or other material to the top surface of the substrate. After printing the patterned metal layer (and forming the superstructure if applicable), a solder preform can be applied, and the LEDs can be placed over the solder preform. A reflow process can be used to melt the solder, thereby bonding the LEDs to the substrate and establishing the desired electrical connectivity. A cover can be applied over the LEDs, e.g., by sealing the cover to the superstructure.

The following detailed description, together with the accompanying drawings, provides a further understanding of the nature and advantages of the claimed invention.

DETAILED DESCRIPTION

Figure 1:
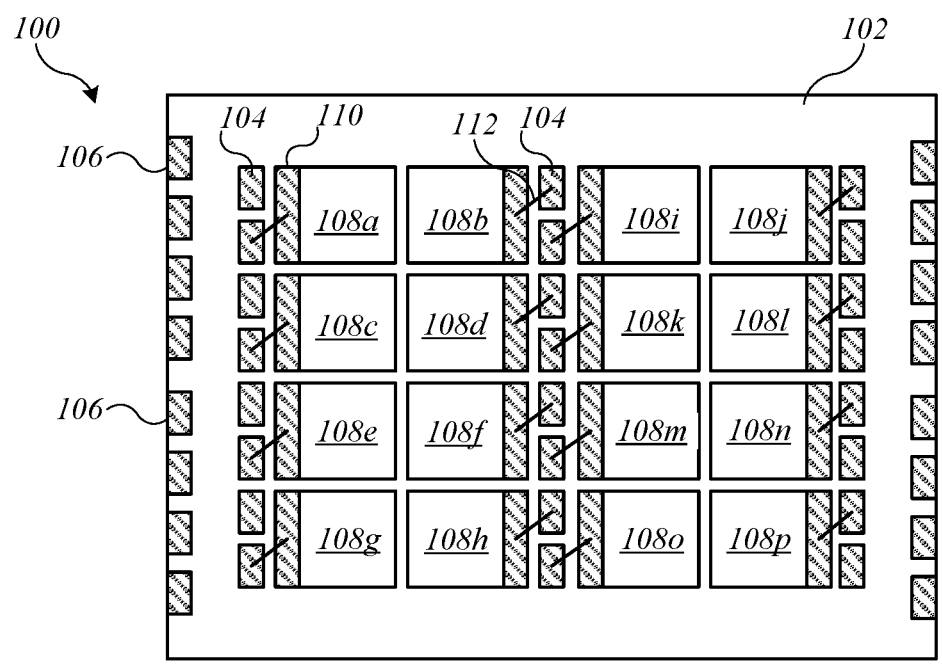
FIG. 1 is a simplified top view of an emitter of a type conventionally used in theater lighting.

FIG. 1 is a simplified top view of an emitter 100 of a type conventionally used in theater lighting. Emitter 100 includes a substrate 102. Substrate 102 may be a multilayer structure, for example a low-temperature cofired ceramic (LTCC) structure, with internal metal traces providing connections between various ones of central metal pads 104 and peripheral metal pads 106. LEDs 108a-p are mounted on substrate 102. Each LED 108a-p may be of conventional design and may include a bottom-surface bonding pad (not shown) and a top-surface bonding pad 110. Each top-surface bonding pad 110 is bonded to one of central metal pads 104 by a wire bond 112; the bottom-surface bonding pads are bonded to corresponding pads (not shown) on the top surface of substrate 102.

Emitter 100 illustrates some of the difficulties with reducing entendue in conventional emitters. For instance, one way to reduce etendue is by reducing the size of the light source. In principle, this can be done by packing LEDs 108a-p more closely. However, as shown in FIG. 1, space is needed to accommodate wire bond pads 104, and this creates gaps between LEDs. Further, top-surface bonding pads 110 on LEDs 108a-p add to the surface area of the luminous region of the emitter without contributing to the emitted light. Overall, gaps between luminous areas may be large, e.g., 150 μm or more. It would be desirable to increase the efficiency with which emitter area is used.

Figure 2A:
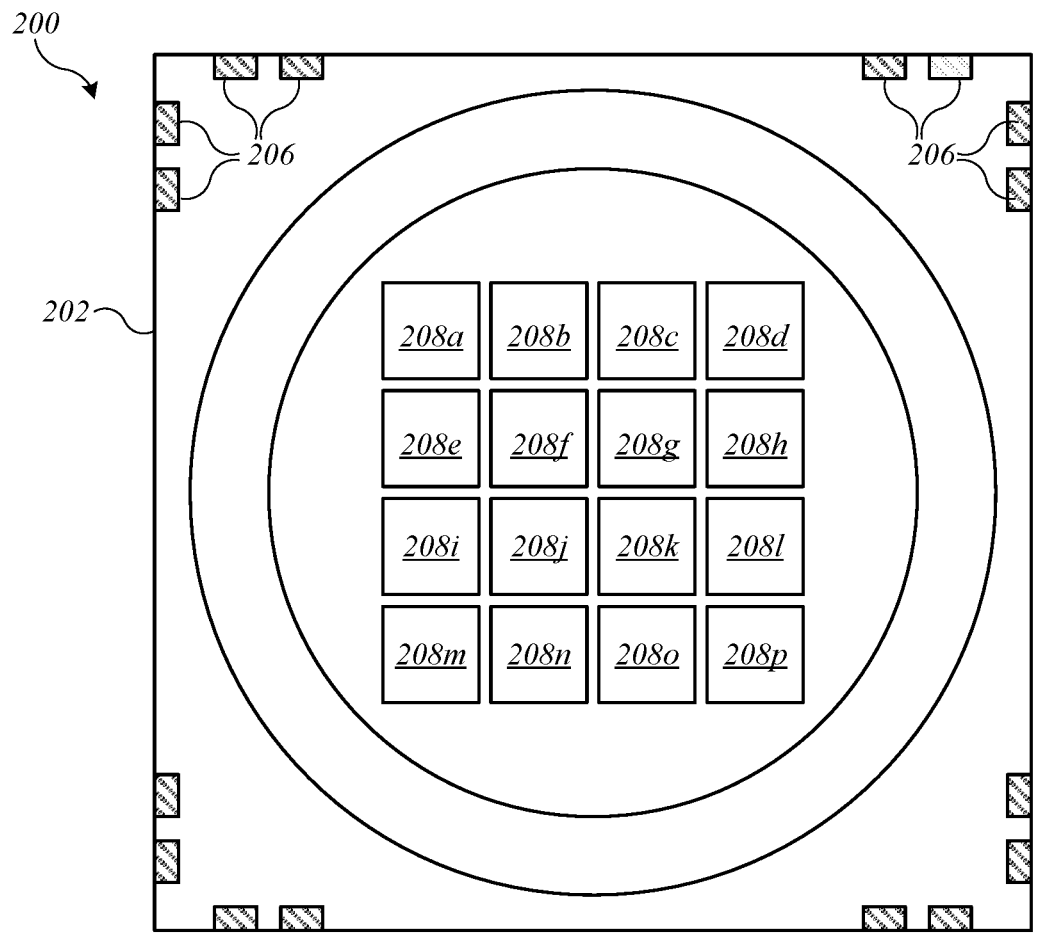
FIGS. 2A and 2B show simplified top views of an emitter according to an embodiment of the present invention.
Figure 2B:
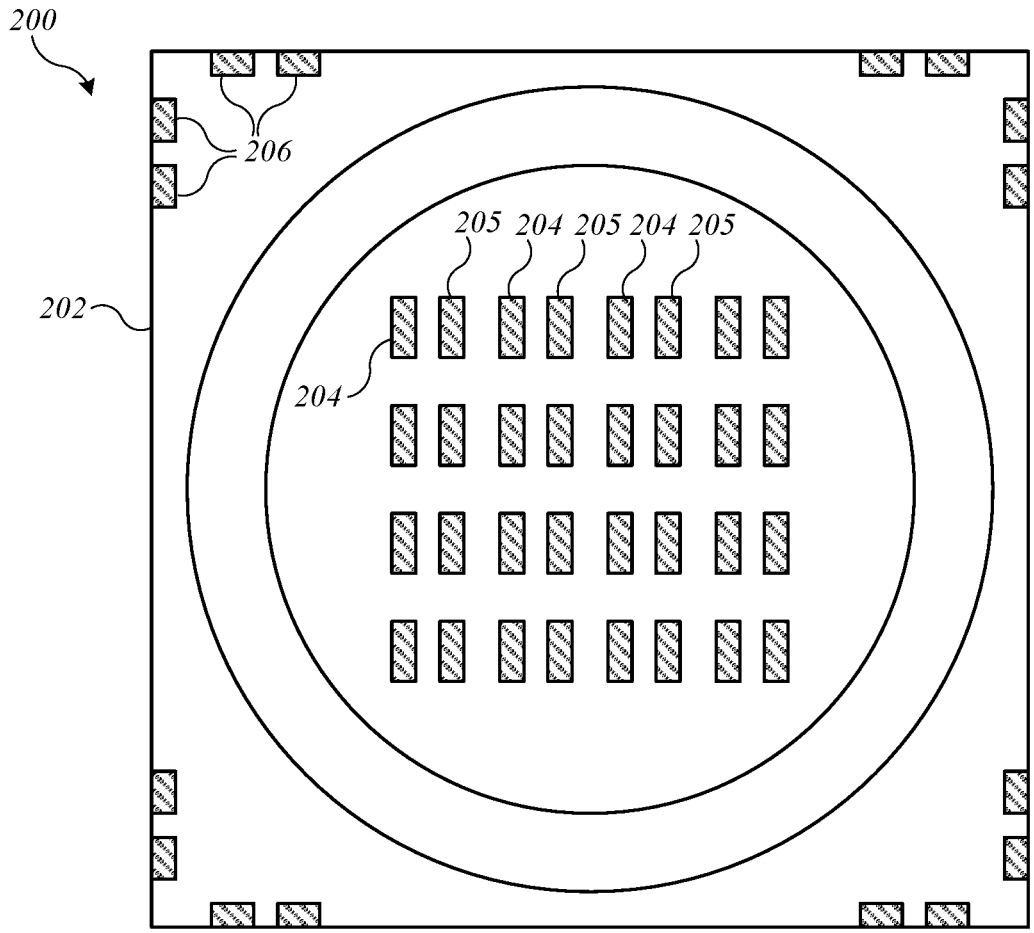

FIGS. 2A and 2B show simplified top views of an emitter 200 according to an embodiment of the present invention.

FIG. 2A shows the emitter including LEDs 208a-p; FIG. 2B shows emitter 200 with LEDs 208a-p removed. Emitter 200 includes a substrate 202. Substrate 202 may be a multilayer structure with internal metal traces providing connections between central metal pads 204, 205 (shown in FIG. 2B) and peripheral metal pads 206. An example of substrate 202 is described below.

Figure 2C:
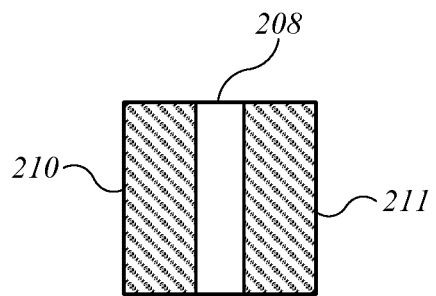
FIG. 2C shows a bottom view of a representative flip-chip LED that can be used in some embodiments of the present invention.

LEDs 208a-p in this example are "flip-chip" LEDs. Instead of having one bonding pad on the top surface and one on the bottom surface (like LEDs 108a-p of FIG. 1), LEDs 208a-p have two bonding pads on the bottom surface (and none on the top surface). FIG. 2C shows a bottom view of a representative flip-chip LED 208 with bonding pads 210, 211 that can be used in some embodiments of the present invention. While two bonding pads are shown, some flip-chip LEDs may have a different number of bonding pads, and the invention is not limited to any particular number or arrangement of LED bonding pads.

As shown in FIG. 2B, substrate 202 provides a first metal pad 204 and a second metal pad 205 for each LED 208a-p. First metal pad 204 can be bonded to bonding pad 210 of LED 208 (shown in FIG. 2C) and second metal pad 205 can be bonded to bonding pad 211. FIG. 2A shows substrate 202 with LEDs 208a-p bonded to corresponding first and second metal pads 204, 205. As can be seen, the space between light-emitting areas is reduced compared to the conventional emitter of FIG. 1. For example, in one embodiment, LEDs 208a-p can each be 1 mm×1 mm square chips, and the gap between adjacent LEDs 208 can be small, e.g., 10 μm or 20 μm or the like. Other LED sizes and spacings can be substituted.

Figure 3:
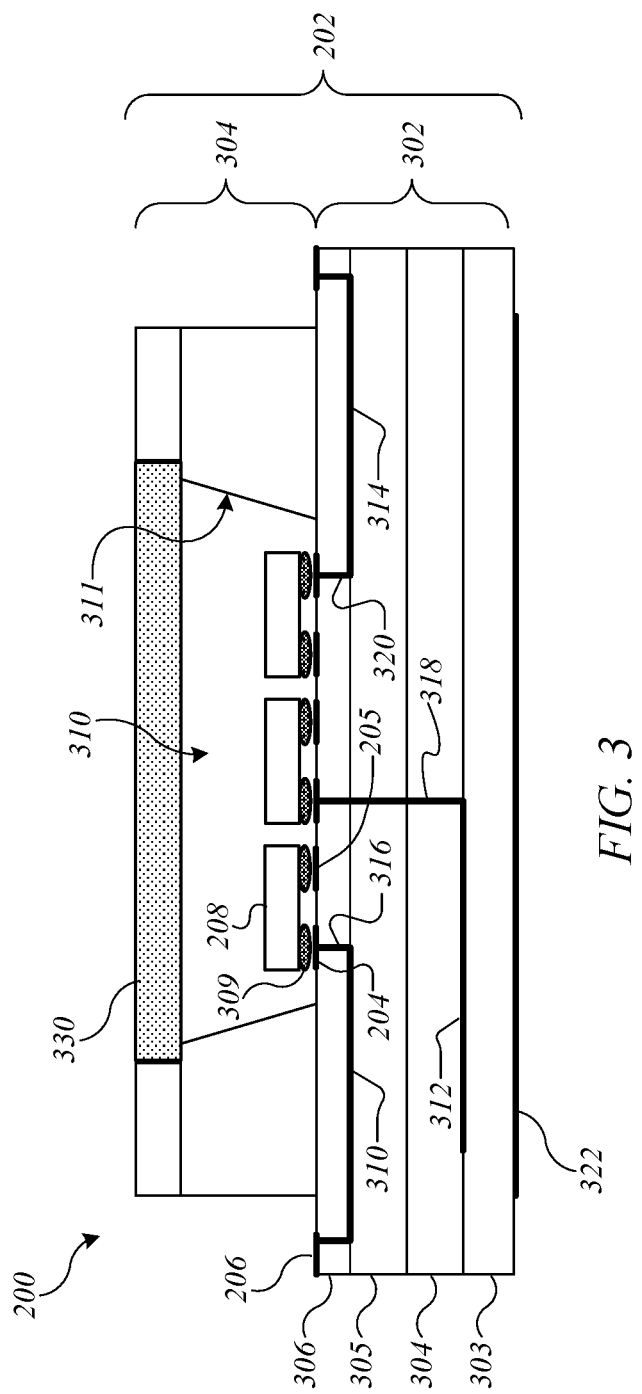
FIG. 3 shows a simplified side cross section view of an emitter according to an embodiment of the present invention.

Substrate 202 provides electrically connectivity to LEDs 208 as well as thermal conductivity to transfer heat away from LEDs 208. FIG. 3 shows a simplified side cross section view of emitter 200 according to an embodiment of the present invention. Substrate 202 includes a base 302 and a superstructure 304.

Base 302 is formed as a series of layers 303-306 of a ceramic material (e.g., alumina or aluminum nitride (AlN)) that provides electrical insulation and high thermal conductivity. Layers 303-306 have different thicknesses that can be optimized to control thermal expansion and thermal stress. For example, layers 303-305 can be 0.15 millimeters (mm) each, and layer 306 can be 0.10 mm. Other dimensions can also be used. First and second metal pads 204, 205 and peripheral metal pads 206 are formed on the top surface of layer 306. LEDs 208 can be bonded to first and second metal pads 204, 205, e.g., using solder 309. Each of first and second metal pads 204, 205 can be connected to one or more of peripheral metal pads 206 using metal lines disposed between ceramic layers 303-306 and vias passing through one or more of ceramic layers 303-306. By way of illustration, FIG. 3 shows interlayer metal lines 310, 312, 314 and vias 316, 318, 320. Metal lines 310, 312, 314 and vias 316, 318, 320 provide electrical connectivity between first and second metal pads 204, 205 and peripheral metal pads 206. (It is to be understood that metal lines such as metal line 312 need not be straight lines. For instance, in the cross section view shown in FIG. 3, metal line 312 may bend into the page and may be connected by a via that is not shown to a peripheral metal pad that is also not shown.) Any configuration of electrical connections may be provided by an appropriate combination of metal lines and vias. In some embodiments, the electrical connections are arranged such that power can be supplied separately to different LEDs 208 or groups of LEDs 208; thus, the LEDs or groups of LEDs are referred to as being "independently addressable." In some embodiments, a metal plate 322 is disposed on the bottom surface of bottom layer 303 to further facilitate heat transfer. Metal plate 322 can be circular and as large as possible. In some embodiments, a heat sink can be attached directly to metal plate 322. Metal plate 322 can be electrically isolated from the various electrical paths and pads that are present on substrate 202.

Superstructure 304 can also be formed of ceramic material and/or other material (e.g., aluminum or other metal). In the example shown, superstructure 304 defines a recess 310 in which LEDs 208 are disposed. Recess 310 can have the shape of a truncated cone, with a circular sidewall 311 that slants inward, e.g., at an angle of about 20° with respect to the vertical axis. Sidewall 311 of recess 310 can be coated with a reflective material (e.g., silver) to increase light output of the device.

Emitter 200 can also include a cover 330. Cover 330 can be made of an optically transparent material such as plastic or glass and can be sealed to superstructure 304 to protect LEDs 208 from the elements. In some embodiments, cover 330 can include color-mixing elements, such as dispersed microbeads, microlenses, or the like. Cover 330 can also provide beam shaping, e.g., by including one or more curved surfaces (not shown).

Emitter 200 is illustrative, and variations and modifications are possible. The number and type of LEDs can be varied as desired. In some embodiments, the LEDs can be high-current LEDs capable of operating at currents of up to, e.g., 3 A or 6 A and a combination of LEDs of different colors or types may be used. For example, some embodiments may include four red LEDs, four green LEDs, four blue LEDs, and four amber LEDs, and the LEDs may be interconnected to provide four independently addressable groups, one group for each color. LEDs of different colors can be interspersed on the surface of substrate 202, to provide for better color uniformity and color mixing. The output light color can be modified by adjusting the relative current supplied to different independently addressable groups; for instance, white light can be produced by supplying current to all groups; red light can be produced by supplying current exclusively or primarily to the red group, and so on.

The particular configuration of electrical paths formed by the vias and interlayer metal lines can also be varied according to the desired arrangement of independently addressable LED groups. In some embodiments, an independently addressable LED group may include just one LED; in other embodiments, some or all LED groups may include two or more LEDs connected in series and/or in parallel (e.g., using vias and interlayer metal lines) and addressable independently of other LEDs or groups of LEDs. Any number of LEDs connected into any number of LED groups can be supported.

Figure 4:
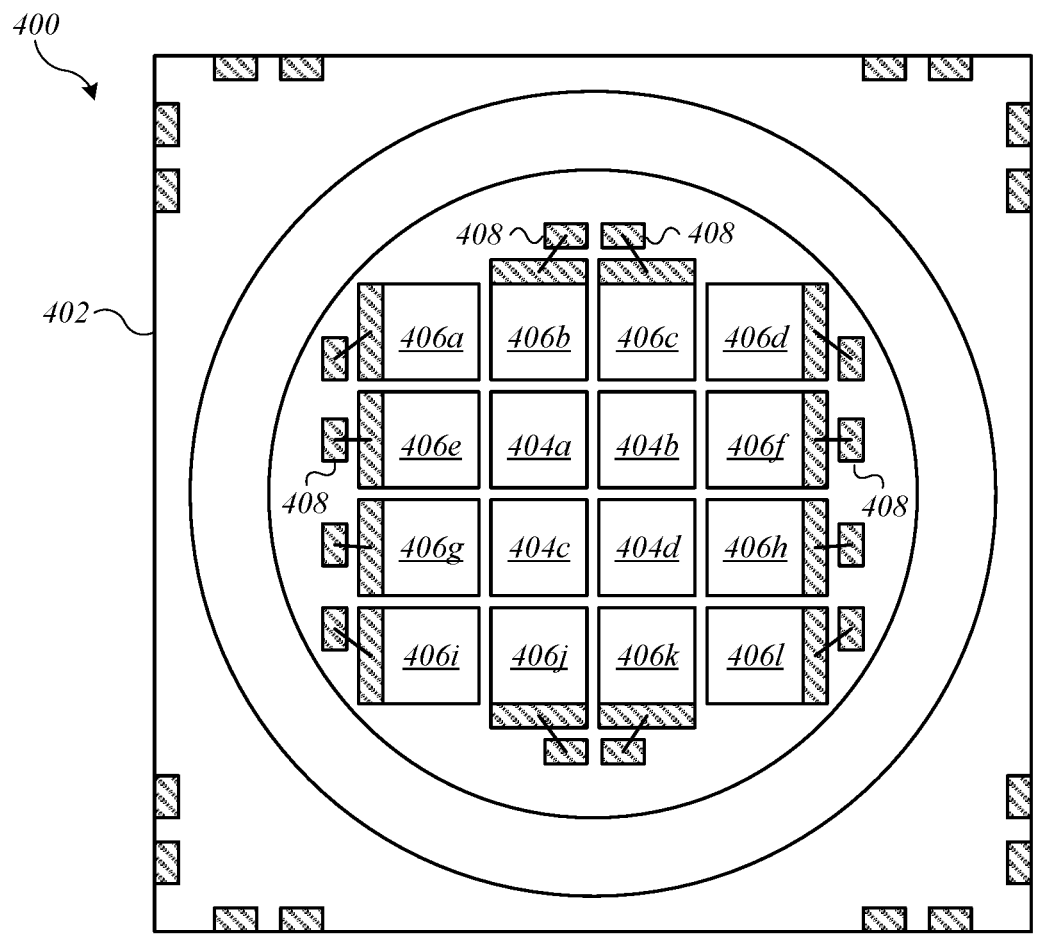
FIG. 4 shows a simplified top view of an emitter according to another embodiment of the present invention.

Further, it is not required that all of the LEDs be of a flip-chip type. By way of illustration, FIG. 4 shows a simplified top views of an emitter 400 according to another embodiment of the present invention. Emitter 400 includes a substrate 402, which can be generally similar to substrate 202 described above. Substrate 402 supports a combination of flip-chip LEDs 404*a-d* (similar to LED 208 shown in FIG. 2C) and wire-bond LEDs 406*a-l* (similar to the LEDs shown in FIG. 1). In this embodiment, wire-bond LEDs 406*a-l* are used in "perimeter" positions in the LED array, i.e., positions where wire bond pads 408 can be placed next to the LED without affecting the spacing between LEDs. Flip-chip LEDs 404*a-d* are used in "central" positions, i.e., positions where a wire bond pad cannot be placed adjacent to the LED without affecting the spacing between LEDs. To the extent that wire-bond LEDs are cheaper than flip-chip LEDs, using wire-bond LEDs in some or all of the perimeter positions may reduce manufacturing cost. Further, in some cases, wire-bond LEDs may operate at higher brightness than flip-chip LEDs of a given size, so use of wire-bond LEDs in some or all of the perimeter positions may increase light output.

As noted above, in order to reduce entendue for a given number and arrangement of LEDs, it is desirable to reduce the spacing between LEDs to the extent possible. The use of flip-chip LEDs, at least in central positions on the substrate, allows spacing to be reduced by eliminating the need to place bonding pads between LEDs. It is noted that flip-chip LEDs can also reduce the non-luminous portion of the surface area since they do not have top-side bonding pads. Thus, an emitter with a given luminous surface area may be able to provide brighter light than is possible using wire-bonded LEDs.

However, the use of closely spaced flip-chip LEDs presents challenges for the fabrication of substrates such as substrate 202 (or substrate 402). For instance, as the density of LEDs on a substrate increases, the heat generated per unit area increases. Substrate 202 (or substrate 402) needs to be able to transfer this heat away without deforming. It has previously been observed (see, e.g., U.S. Pat. No. 8,394,097, issued Feb. 26, 2013) that substrates fabricated from high-temperature cofired ceramic (HTCC) provide enhanced thermal performance relative to commonly-used low-temperature cofired ceramic (LTCC) substrates.

Existing fabrication processes for HTCC substrates limit the precision with which metal structures (vias, traces, and metal pads) can be aligned. This poses a challenge for closely-spaced flip-chip LEDs (e.g., spacing of 20 μm), as even a small misalignment between first and second metal pads 204, 205 on substrate 202 and bonding pads 210, 211 of LEDs 208 may lead to shorting or other electrical failures. Further, simply reducing the size of first and second metal pads 204, 205 may not be desirable because larger metal pads can help to spread heat over a larger area of substrate 202 to facilitate heat dissipation, which is particularly helpful for LEDs operating at high current.

Figure 5:
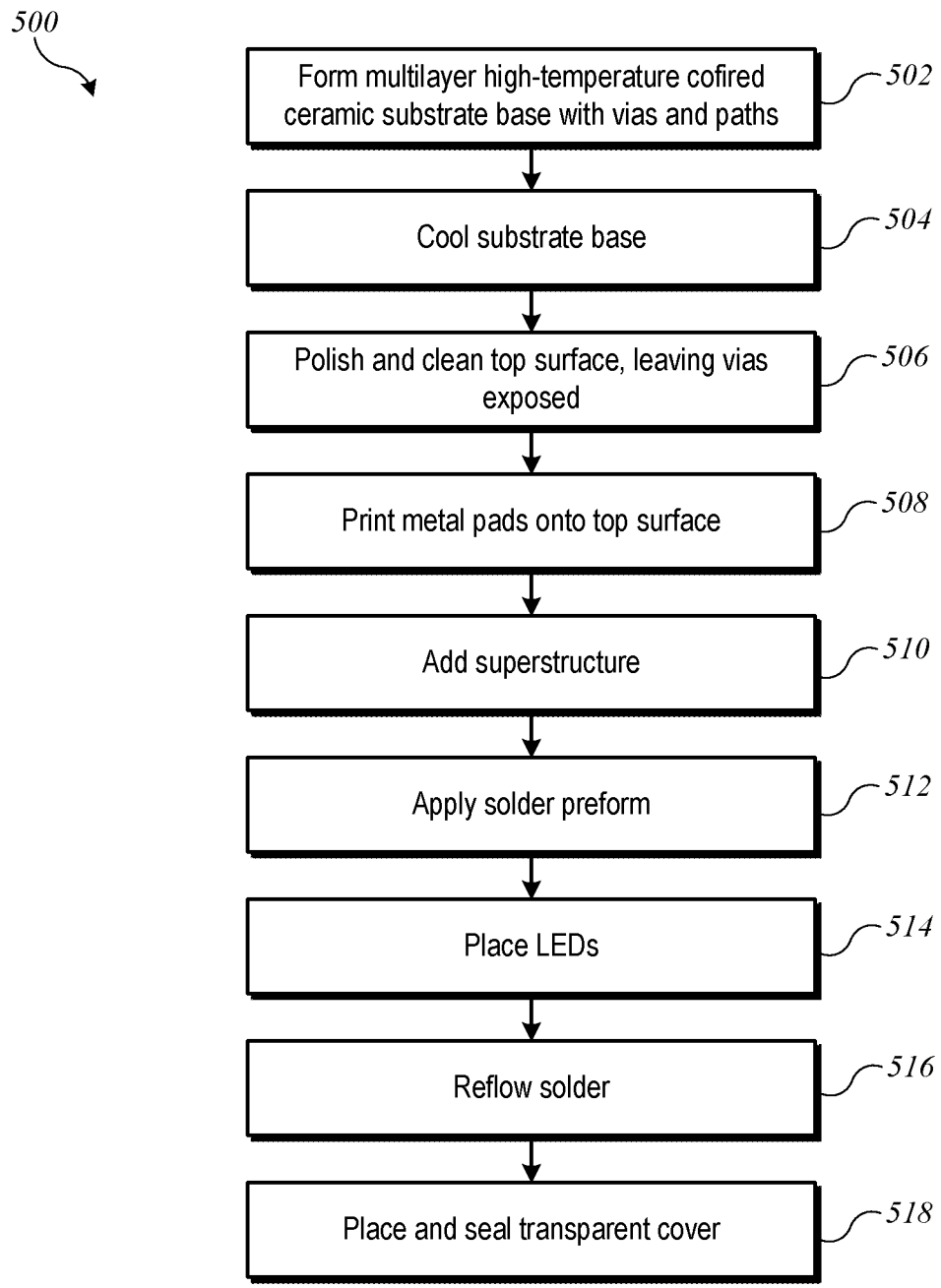
FIG. 5 is a flow diagram of a process for fabricating an emitter according to an embodiment of the present invention.

Accordingly, some embodiments of the present invention provide fabrication processes that improve the precision in the location of metal pads (such as metal pads 204, 205) on the top surface of an HTCC substrate. FIG. 5 is a flow diagram 500 of a process for fabricating an emitter according to an embodiment of the present invention. Process 500 can be used to fabricate emitters such as emitter 200 (or emitter 400).

At block 502, a multilayer HTCC substrate base with vias and paths (e.g., base 302 shown in FIG. 3) is fabricated. Examples of fabrication processes are described in U.S. Pat. No. 8,394,097, issued Feb. 26, 2013, the disclosure of which is incorporated by reference herein. This fabrication process for the HTCC substrate base in this embodiment includes fabricating and cofiring the layers and vias of the HTCC substrate base but does not include fabricating the metal pads on the top surface of base 302. Thus, the product after block 502 can be a multilayer HTCC substrate base (e.g., base 302) with vias exposed at the top surface.

At block 504, the multilayer HTCC substrate base is cooled, e.g., to room temperature. At block 506, the top surface of the multilayer HTCC substrate base is polished and cleaned, e.g., using conventional techniques for mechanically polishing and cleaning a ceramic surface. The polishing and cleaning provides a uniformly flat top surface with exposed vias.

At block 508, metal pads (e.g., metal pads 204, 205, 206 shown in FIG. 2B) are printed onto the top surface of the HTCC substrate base. Techniques used for printing metal pads onto semiconductor or low-temperature cofired ceramic (LTCC) devices (e.g., masking and depositing metal at or near room temperature) can be used. The location of an exposed end of a via within the area occupied by a metal pad need not be precisely controlled, as long as that location is somewhere within the area so that the pad is electrically connected to the via.

At block 510, a superstructure (e.g., superstructure 304 of FIG. 3) can be added over the top surface of the HTCC substrate base. For instance, superstructure 304 can be formed using an HTCC fabrication process and bonded to the top surface. Superstructure 304 can also be fabricated from other materials.

At block 512, a solder preform can be applied to the metal pads to which LEDs are to be bonded. At block 514, the LEDs can be placed on the solder preform, and at block 516, the solder can be reflowed to bond the LEDs to the metal pads; weights may be placed on top of the LEDs to facilitate reflow. In some embodiments, solder preforms are used for bonding to pads on the bottom surfaces of the LEDs; for any wire-bonded LEDs, the wire bonding may be performed in a separate processing step.

At block 518, a transparent cover can be placed over the LEDs (e.g., as shown in FIG. 3) and sealed in place (e.g., using optically transparent adhesive).

It will be appreciated that process 500 is illustrative and that variations and modifications are possible. Blocks or acts described sequentially can be performed in parallel, and order of acts can be varied to the extent logic permits. For instance, the superstructure can be added before or after placing and/or bonding LEDs, or the superstructure can be omitted entirely if desired.

While the invention has been described with respect to specific embodiments, those skilled in the art will recognize that numerous modifications are possible. For instance, the number of LEDs and electrical connectivity thereof can be varied as desired. Thus, in various embodiments, each LED might be its own independently addressable group, or multiple LEDs can be connected together (in series and/or parallel) to form an independently addressable group. Any number of independently addressable LED groups containing any number of LEDs can be provided. Heat transfer away from the LEDs is provided by the substrate itself, independently of the electrical connectivity.

Any number and type(s) of LED can be used, including but not limited to conventional red, green, blue, amber, white, infrared, and ultraviolet LEDs. Further, different types of LEDs can coexist on the same substrate. Wavelength-shifting material (e.g., phosphor-containing material) may be applied to the surface of some or all of the LEDs, incorporated into the recess and/or the cover, or omitted entirely. The physical arrangement of LEDs can be a grid as shown above or other arrangement, depending on the number of LEDs and the desired geometry of the emitter. To provide close spacing of LEDs (and thus small overall source size), any LED in a central position (as defined above) can be a flip-chip LED, while any LED in a peripheral position (as defined above) can be either a flip-chip LED or a wire-bonded LED.

In some embodiments, an emitter may also incorporate other components not shown herein. For example, an emitter can incorporate various sensors, including light sensors, motion sensors, occupancy sensors, temperature sensors, or the like. Signals provided by such sensors may be used to adjust operation of the LEDs. As another example, an emitter can incorporate driver and/or control circuitry in the form of one or more integrated circuits, which may be disposed peripherally to the LEDs to avoid increasing the area of the active light source.

The form factor of an emitter or substrate may also be varied from the examples shown herein. Emitters or substrates can be larger or smaller than examples provided and can be fabricated in various shapes including square shapes (as shown), circular shapes, rectangular shapes. hexagonal shapes, star shapes, etc. Thickness of substrates or substrate layers can also be varied, and the ceramic superstructure can be modified, replaced with a different superstructure (e.g., a predominantly or entirely metal structure) or omitted entirely. An emitter can be covered with a flat cover (as shown above), a curved cover, an elongated cover such as a color-mixing rod, or any other cover as desired. In addition to protecting the LEDs from the elements, the cover can provide color mixing and/or beam shaping effects.

Emitters of the kind described herein can be incorporated into lighting devices, including stage lighting devices such as spotlights. Such lighting devices may include an emitter as described above and may also include control and/or driver circuitry to supply current to the independently addressable LEDs or groups of LEDs to produce a desired light color. A lighting device may also include secondary optical elements such as a total internal reflection (TIR) lens to collimate and/or color-mix the light emerging from the emitter, beam shaping optics that may allow variable control over the width and/or spread of the beam, and so on.

Further, stage lighting is just one example of a use for emitters of the kind described herein. Such emitters can be used in any context where precise positioning of LEDs, individual addressability, and/or operation at high current density are desired.

Thus, although the invention has been described with respect to specific embodiments, it will be appreciated that the invention is intended to cover all modifications and equivalents within the scope of the following claims.

What is claimed is:

1. A method for fabricating an emitter for an LED-based lighting device, the method comprising:
    fabricating a substrate base having a plurality of layers of high-temperature cofired ceramic (HTCC) material, a plurality of metal paths disposed between the layers, and a plurality of vias interconnecting the plurality of metal paths;
    polishing and cleaning a top surface of the substrate base, wherein top ends of a subset of the plurality of vias are exposed at the top surface;
    after polishing and cleaning the top surface of the substrate base, printing a plurality of metal pads on the top surface of the substrate base such that at least some of the metal pads are printed onto the top ends of the subset of the plurality of vias;
    bonding a plurality of LEDs to the at least some of the metal pads, wherein at least one of the plurality of LEDs is a flip-chip LED; and
    adding a superstructure made of HTCC after polishing and cleaning the top surface of the substrate base, wherein the superstructure is disposed on the top surface of the substrate base around an area containing the LEDs.

2. The method of claim 1 wherein at least four of the plurality of LEDs are flip-chip LEDs.

3. The method of claim 1 wherein all of the plurality of LEDs are flip-chip LEDs.

4. The method of claim 1 wherein the plurality of LEDs includes a first plurality of central LEDs and a second plurality of peripheral LEDs disposed around the first plurality of central LEDs, wherein at least the central LEDs are flip-chip LEDs.

5. The method of claim 4 wherein the peripheral LEDs are also flip-chip LEDs.

6. The method of claim 4 wherein the peripheral LEDs have top-side wire bonding pads and wherein bonding the plurality of LEDs to the at least some of the metal pads includes connecting wire bonds between the top-side wire bonding pads and a subset of the metal pads.

7. The method of claim 1 wherein the superstructure is added after bonding the plurality of LEDs to the at least some of the metal pads.

8. The method of claim 1 further comprising:
placing and sealing a transparent cover over the plurality of LEDs.

9. The method of claim 1 wherein the plurality of metal paths and the plurality of vias are arranged to connect the plurality of LEDs into two or more independently addressable groups of LEDs wherein each independently addressable group of LEDs includes at least one LED.

10. An emitter comprising:
a substrate base that includes a plurality of layers of high-temperature cofired ceramic (HTCC) material, a plurality of metal paths disposed between the layers, and a plurality of vias through the layers and interconnecting the plurality of metal paths, wherein at least some of the vias have top ends that extend through a top layer of the plurality of layers of HTCC material;
a plurality of metal pads printed onto the top layer and covering the top ends of the at least some of the vias, wherein the metal pads are printed onto the top layer after fabrication of the substrate base;
a plurality of LEDs bonded to the metal pads, the plurality of LEDs including a first plurality of central LEDs and a second plurality of peripheral LEDs, wherein at least the central LEDs are flip-chip LEDs,
wherein none of the metal pads are disposed in an area between the LEDs; and
a superstructure made of high-temperature co-fired ceramic, wherein the superstructure is disposed on top of the substrate base around an area containing the LEDs.

11. The emitter of claim 10 wherein adjacent ones of the LEDs are spaced apart by a distance of 20 µm or less.

12. The emitter of claim 10 wherein the LEDs are arranged along a grid and adjacent ones of the LEDs are spaced apart by a distance of 20 µm or less.

13. The emitter of claim 12 wherein the plurality of LEDs includes at least sixteen LEDs.

14. The emitter of claim 10 wherein all of the LEDs are flip-chip LEDs.

15. The emitter of claim 10 wherein at least some of the peripheral LEDs have at least one top-side wire bonding pad.

16. The emitter of claim 10 wherein:
at least one of the peripheral LEDs has a top-side wire bonding pad;
the plurality of metal pads includes at least a first metal pad disposed outside a periphery of an area occupied by the LEDs; and
the top-side wire bonding pad is wire-bonded to the first metal pad.

17. The emitter of claim 10 further comprising:
an optically transparent cover attached to the superstructure and overlying the area occupied by the LEDs.

18. The emitter of claim 10 wherein the plurality of metal paths and the plurality of vias are arranged to connect the plurality of LEDs into two or more independently addressable groups of LEDs wherein each independently addressable group of LEDs includes at least one LED.

19. An emitter comprising:
a substrate base that includes a plurality of layers of high-temperature cofired ceramic (HTCC) material, a plurality of metal paths disposed between the layers, and a plurality of vias through the layers and interconnecting the plurality of metal paths, wherein at least some of the vias have top ends that extend through a top layer of the plurality of layers of HTCC material;
a plurality of metal pads printed onto the top layer and covering the top ends of the at least some of the vias, wherein the metal pads are printed onto the top layer after fabrication of the substrate base; and
a plurality of LEDs bonded to the metal pads, the plurality of LEDs including a first plurality of central LEDs and a second plurality of peripheral LEDs, wherein the central LEDs are flip-chip LEDs and wherein the peripheral LEDs have top-side wire bonding pads that are wire-bonded to a subset of the metal pads,
wherein none of the metal pads are disposed in an area between the LEDs.

20. The emitter of claim 19 further comprising:
a superstructure made of high temperature co fired ceramic, wherein the superstructure is disposed on top of the substrate base around an area containing the LEDs; and
an optically transparent cover attached to the superstructure and overlying the area occupied by the LEDs.

* * * * *